United States Patent [19]
Bartlett

[11] 4,246,593
[45] Jan. 20, 1981

[54] HIGH DENSITY STATIC MEMORY CELL WITH POLYSILICON RESISTORS

[75] Inventor: Keith G. Bartlett, Houston, Tex.

[73] Assignee: Texas Instruments Incorporated, Dallas, Tex.

[21] Appl. No.: 623

[22] Filed: Jan. 2, 1979

[51] Int. Cl.³ .................................... H01L 27/02
[52] U.S. Cl. ................................. 357/41; 357/23; 357/45; 357/50; 357/51; 357/59
[58] Field of Search ............... 357/23, 41, 45, 51, 357/50, 59

[56] References Cited
U.S. PATENT DOCUMENTS 4,110,776  8/1978  Rao et al. ....................... 357/51
4,160,987  7/1979  Dennard et al. ................. 357/59

Primary Examiner—Edward J. Wojciechowicz
Attorney, Agent, or Firm—John G. Graham

[57] ABSTRACT

A semiconductor memory of the static type employs a pair of cross-coupled driver transistors which are formed by a method which results in field oxide over the source and drain regions. Access transistors are formed by a different method and have silicon gates self-aligned with their source and drain diffusions. The load devices are ion-implanted polycrystalline silicon strips which overlie the driver transistors. These features permit a very small cell layout with a minimum of space used for the cross-coupling connections, and the polysilicon address line can cross over the ground line.

10 Claims, 11 Drawing Figures

HIGH DENSITY STATIC MEMORY CELL WITH POLYSILICON RESISTORS

BACKGROUND OF THE INVENTION

This invention is directed to semiconductor devices and more particularly to improved static memory cells of the type formed in MOS integrated circuit form.

Static memory devices are preferable over dynamic devices in some types of digital equipment because the refresh overhead inherent in dynamic memories is unnecessary. This is particularly true in microcomputers using relatively small memory arrays where the refresh circuitry would be larger in proportion to the memory circuitry. Static cells traditionally employed six transistor bistable circuits wherein depletion-mode MOS transistors were used as load devices. These cells were much larger in cell area than one transistor cells of dynamic memories, so the density in cells per chip was rather low. Thus, the cost of static memory has been much higher than dynamic. In efforts to reduce the cell size and thus increase cell density on a chip, various improvements have been made in cell layout and manufacturing processes. The design rules or minimum line widths and tolerances have been reduced, and also cell structures which reduce the number of contacts per cell and increase the efficiency in the use of various crossovers and the like have been attempted. One of the major improvements has been the use of implanted polycrystalline silicon resistors as the load devices in the conventional bistable circuit as disclosed in U.S. Pat. No. 727,116 issued to Rao et al and copending applications Ser. No. 801,699, filed May 31, 1977 by Raymond & Lien, and Ser. No. 910,248, filed May 30, 1978 by McElroy, all assigned to Texas Instruments. Other static memory cell designs which provide higher density and lower power dissipation are shown in pending applications Ser. Nos. 925,891, 925,892, 925,893 and 925,916, all filed July 19, 1978 by Caudel, McElroy, Ponder and Tubbs, respectively, all assigned to Texas Instruments. While very notable improvements have been made, a continuing effort to reduce cell size and simplify manufacture is dictated by the demand for higher density and lower cost.

It is a principal object of this invention to provide improved static memory cells for semiconductor memory devices. Another object is to provide cell designs of high density in MOS static memory arrays. An additional object is to provide improved layout techniques for MOS integrated circuits which permit simplified interconnections using less space on a semiconductor chip.

SUMMARY OF THE INVENTION

In accordance wih one embodiment of the invention, a semiconductor memory of the static type employs a pair of cross-coupled driver transistors which are formed by a method which results in field oxide over the source and drain regions. Access transistors are formed by a different method and have silicon gates self-aligned with their source and drain diffusions. The load devices are ion-implanted second level polycrystalline silicon strips which overlie the driver transistors. These features permit a very small cell layout with a minimum of space used for the cross-coupling connections, and the polysilicon address line can cross over the ground line.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

Figure 1:
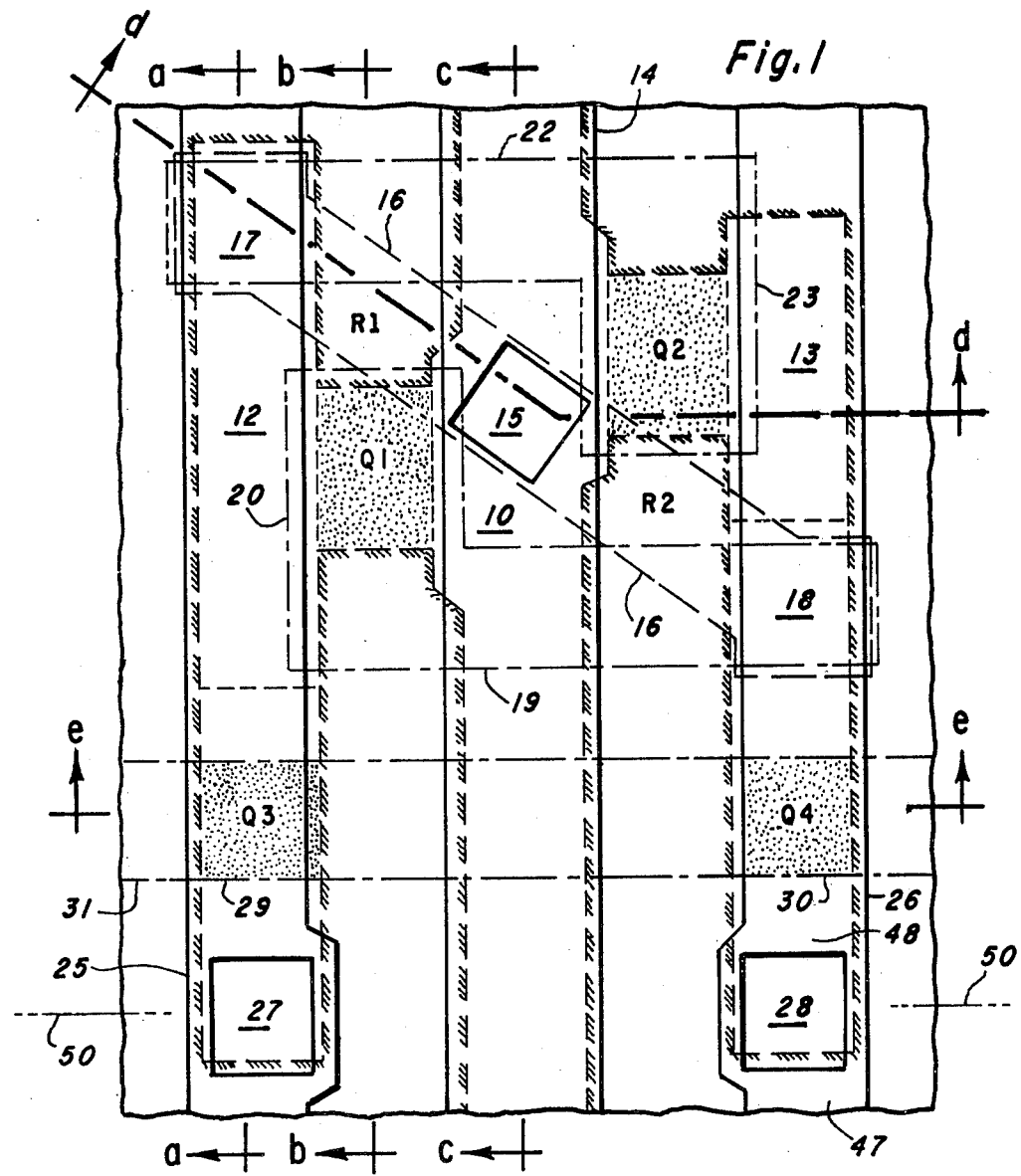
FIG. 1 is a greatly enlarged plan view of a small portion of a semiconductor chip showing the physical layout of a static RAM cell having the features of the invention.

Referring to FIG. 1, a physical layout is shown of an N-channel silicon gate MOS static RAM cell which utilizes the features of the invention. This cell is of course greatly enlarged in FIG. 1, as it would actually occupy less than about one square mil, i.e., the larger dimension of the cell of FIG. 1 would not be more than about one mil. The cell is also shown in FIG. 2 as an electrical schematic diagram, with the parts numbered the same as FIG. 1.

Figure 2:
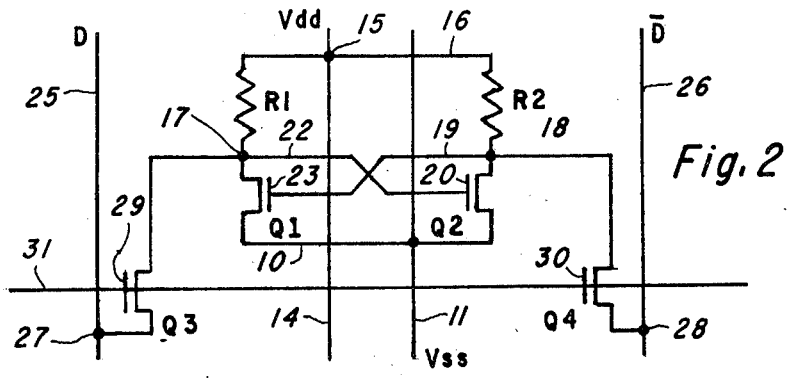
FIG. 2 is an electrical schematic diagram of the cell of FIG. 1.

The cell in FIGS. 1 and 2 consists of a pair of cross-coupled driver transistors Q1 and Q2 having a common source 10 which is part of an elongated N+ region 11 functioning as a ground or Vss line. The N+ region 11 is buried under thin field oxide. Each of the transistors Q1 and Q2 has an N+ drain region 12 or 13, respectively, forming the storage nodes which are electrically connected to Vdd or positive supply line 14 through resistors R1 or R2. According to a feature of the invention, the resistors R1 and R2 are formed by ion-implanted second level polycrystalline silicon strips. The Vdd supply line 14 is an elongated metal strip running above and parallel to the Vss line 11. A metal-to-poly contact area 15 connects the Vdd line 14 to the center of a polysilicon strip 16 containing the resistors R1 and R2. Poly-to-moat contacts 17 and 18 at opposite ends of the strip 16 form connections to the N+ drains 12 and 13. A first-level polysilicon conductor 19 connects the poly gate 20 of the transistor Q1 to the drain 13 at the contact area 18. Likewise, a first-level polysilicon strip 22 forms the gate 23 of the transistor Q2 and connects to the drain 12 at the poly-to-moat contact 18, providing the cross-coupling connection of a bistable or flip-flop circuit. Metal strips 25 and 26 provide data and data bar lines (usually referred to D and $\overline{D}$, or as D0 and D1) and these are connected to the drains 12 and 13 via coupling transistors Q3 and Q4 and metal-to-moat contacts 27 and 28. The gates 29 and 30 of the transistors Q3 and Q4 are part of a word address line 31 which is a first-level polysilicon strip.

Referring to FIGS. 3a–3e, sectional views of the cell of FIG. 1 show details of construction. The cell is a small part of a substrate 32 of P-type silicon. The transistors Q1, Q2, Q3 and Q4 are formed in elongated moat regions in which N+ diffused regions 10, 11, 12, 13, etc., create the source and drain regions for the transistors and connections between various regions. The transistors Q1 and Q2 are formed by a process wherein the N+ regions are under a thin field oxide layer 33, whereas the transistors Q3 and Q4 are formed by a self-aligned process and are surrounded by thick field oxide 34, as will be explained. Also, N+ regions in the moats form the lower parts of the metal-to-moat or poly-to-moat contacts 17, 18, 27 and 28. A thin silicon oxide gate dielectric layer 35 and phosphorus-doped first-level polysilicon areas 16, 19, 20, 22, 23, 29, 30 and 31 form gates of the transistors, interconnections, and the address line. Thick field oxide 34 exists at all areas where moats including N+ diffused regions or transistors do not exist, and a P+ boron-doped channel-stop region is created under all areas of the thick field oxide 34. An insulating layer 36 is formed over the entire top surface, overlying the second-level polysilicon, the field oxide 34, and the N+ regions. The lines 14, 25 and 26 are metal strips overlying this insulating layer 36.

Figure 3A:
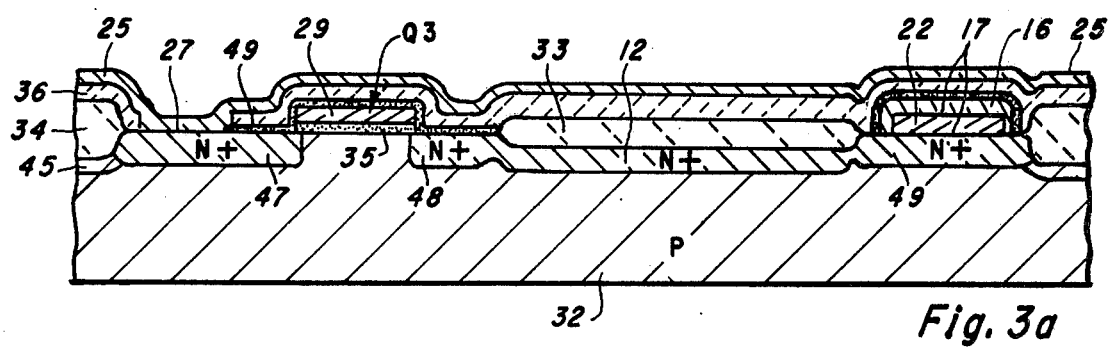
FIGS. 3a–3e are elevation views in section of the cell of FIG. 1, taken along the lines a—a, b—b, c—c, d—d, and e—e respectively.
Figure 3B:
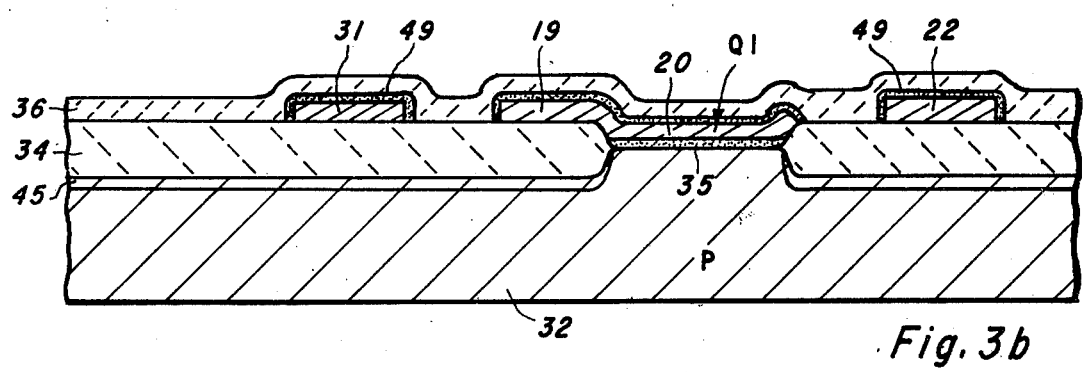
Figure 3C:
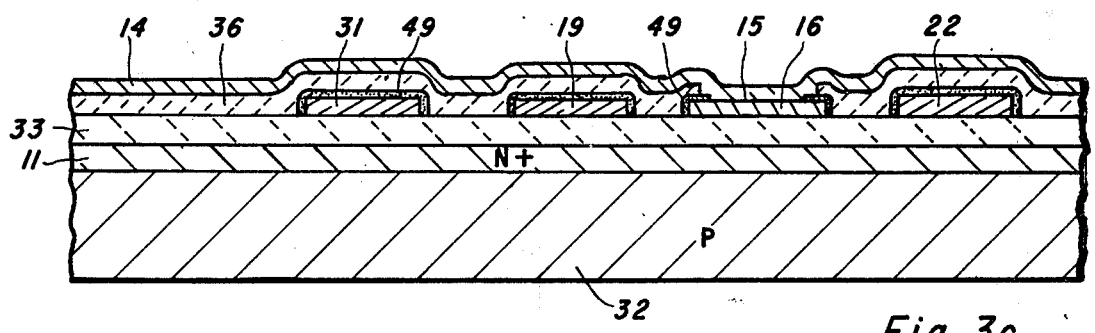
Figure 3D:
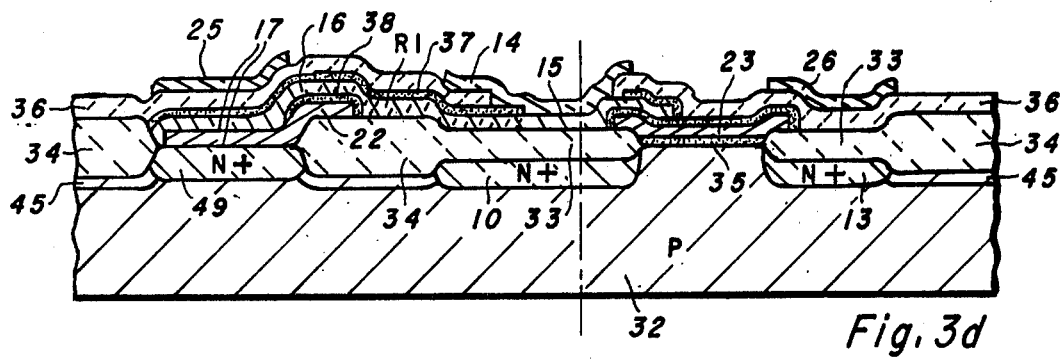
Figure 3E:
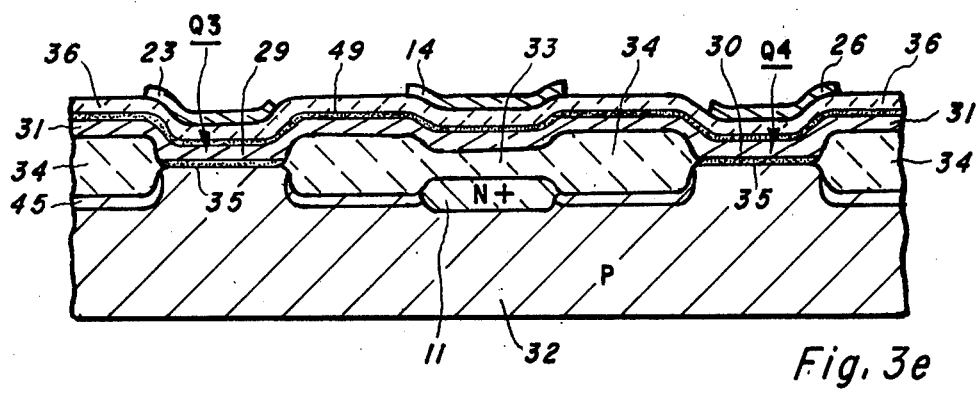

As seen in FIG. 1 and FIG. 3d, the resistors R1 and R2, according to a feature of the invention, each consist of lightly doped, ion-implanted second level polysilicon in the strip 16; the resistor areas are covered by an oxide coating 37 while the center and ends of the strip are heavily doped. The second level poly is insulated from the first level by an oxide coating 38 on the first level poly. Due to the fact that the resistors R1 and R2 overlie the transistors Q1 and Q2, in combination with the simpler cross-over connections made possible by the process with diffusion under thin field oxide, the cell of FIGS. 1–3 is potentially much smaller in size compared to prior static cells using implanted resistors in first level or second level polysilicon as disclosed in applications Ser. Nos. 727,116 and 801,699.

It is important to note that the first level polysilicon (or its underlying thin oxide) does not function as a diffusion mask to form the transistors Q1 and Q2; however, the first level polysilicon strip 31 and gates 29 and 30 define the extent of the N+ diffusion, by means of the thin gate oxide which is the diffusion mask, to form the source and drain of the transistors Q3 and Q4. The first level poly segments 19, 20, 22 and 23 can cross over moats without creating transistors. In other double-level poly processes such as shown in applications Ser. No. 648,594, filed Jan. 12, 1976 by C-K Kuo, or Ser. No. 754,144, filed Dec. 27, 1976 by L. S. Wall, the second-level poly is used to define the boundaries of the N+ diffusion, so that neither first nor second level poly interconnections can cross over an N+ diffused moat. In static cell manufacturing methods where double-level poly processes such as shown in Ser. Nos. 801,699 or 910,248 are used, only one of the levels of polysilicon can cross moats or diffused regions. In the device shown here there is no such constraint; the first or second level of polysilicon can cross over an N+ moat without forming a transistor.

Figure 4A:
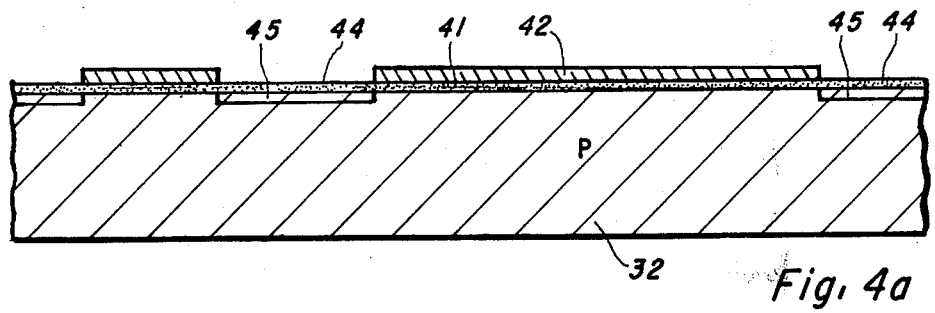
FIGS. 4a–4d are elevation views in section of the semiconductor device of FIGS. 1 and 3, at successive states in the manufacturing process, taken along the line d—d in FIG. 1.

Referring now to FIGS. 4a–4d, a process for making the N-channel, silicon-gate, self-aligned, single-level poly, MOS integrated circuit device of FIGS. 1 and 3–3d will be described. The starting material is a thin slice of P-type monocrystalline silicon, perhaps three or four inches in diameter, cut on the -100- plane, of semiconductor grade with a resistivity of about five to fifty ohm-cm. In FIG. 3 or 4a, a wafer or body 32 represents a very small part of the slice of about one mil in lateral dimension, chosen as a representative sample cross section. Typically, a slice would contain hundreds of bars or chips and each chip would contain perhaps 16K or 64K cells. First, after appropriate cleaning, the slice is oxidized by exposing to oxygen in a furnace at an elevated temperature of about 1000° C. or above to produce an oxide layer 41 of a thickness of about 750 Angstroms. Next a layer 42 of silicon nitride $Si_3N_4$ about 1000 Angstroms thick is formed by exposing to an atmosphere of dichlorosilane and ammonia in a CVD reactor. A coating of photoresist is applied to the entire top surface, then exposed to ultraviolet light through a mask which defines the desired pattern, and developed, leaving areas where nitride is to be etched away and thick field oxide 34 is to be grown. Alternatively, smaller geometries and thus smaller cell sizes may be obtained by using X ray or electron beam lithography in place of UV light and glass masks to expose the photoresist; X-ray lithography is described in Electronics, Nov. 9, 1978, p. 99 and electron beam lithography is disclosed in Bell Laboratories Record, Mar. 1976, p. 69–72 and Electronic Products, Feb. 1977, p. 17. The slice is next subjected to a plasma etch, which removes the areas 44 of the nitride layer 42 not covered by the exposed photoresist, but does not remove the oxide layer 41 and does not react with the photoresist.

The slice is next subjected to an ion implant step, whereby boron atoms are implanted in the areas 44 of silicon not covered by photoresist and nitride 42. The photoresist is left in place as an implant mask. Boron is an impurity which produces P-type conductivity, so more heavily doped P+ regions 45 will be produced in the surface. The oxide layer 41 is left in place during the implant because it prevents the implanted boron atoms from out-diffusing from the surface during subsequent heat treatment. The boron implant is at a dosage of about $4 \times 10^{12}/cm^2$ at 100 KeV. After the implant, the photoresist layer is removed.

As will be seen, the regions 45 do not exist in the same form in the finished device, because some of this part of the slice will have been consumed in the oxidation procedure. The implanted regions 45 will ultimately produce the P+ channel stop regions.

As set forth in U.S. Pat. No. 4,055,444, issued Oct. 25, 1977 to G. R. Mohan Rao, assigned to Texas Instruments, the next step in the process is to subject the slice to a heat treatment or annealing step, during which the slice is maintained at a temperature of about 1000° C. for about two hours in an inert atmosphere, preferably nitrogen. This step causes the boron concentration to change markedly, which has desirable effects aside from reduction in bulk damage in the crystal structure. The P+ regions 45 penetrate deeper into the silicon surface during this anneal step.

Figure 4B:
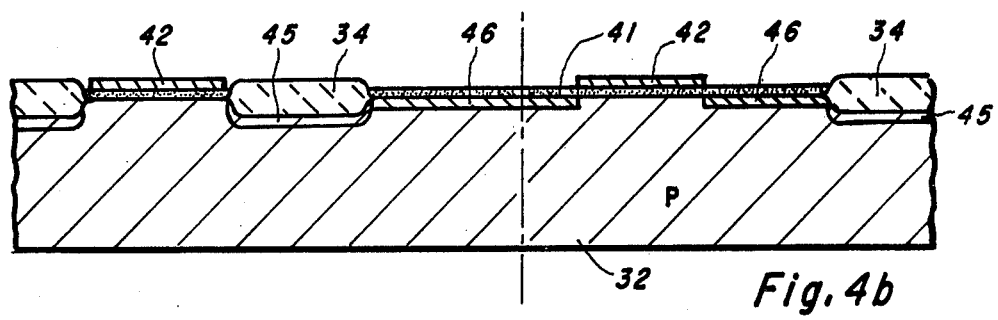

The following step is formation of the initial layer of the thick field oxide 34, which is done by subjecting the slices to steam or an oxidizing atmosphere at about 950° C. or above for several hours. As seen in FIG. 4b, this causes part of the thick field oxide layer 34 to be grown, and this layer extends into the silicon surface because silicon is consumed as it oxidizes. The nitride layer 42 masks oxidation beneath it. The thickness of this layer 34 is about 9000 Angstroms at this point, half of which is above the original surface and half below. The boron doped P+ region 45 as previously implanted and modified by the anneal step will be partly consumed, but will also diffuse further into the silicon ahead of the oxidation front. The channel stop P+ regions which result will be deeper and of more uniform and acceptable concentration at the surface compared to what would have resulted without the anneal step. Also, the channel stop regions will not have the extent of crystalline structure damage characteristic of implanted devices.

The slice is now coated with another photoresist layer and then exposed to ultraviolet light through a mask which defines the source and drain areas 12 and 13 as well as the Vss lines 11 which are to be N+ diffused. After developing the photoresist the slice is again subjected to a nitride etchant which removes the parts of the nitride layer 42 now exposed by holes in the photoresist. The parts of the oxide layer 41 exposed when this nitride is removed are then etched to expose bare silicon. An arsenic ion implant produces the N+ regions 46 which will subsequently become the sources, drains, and Vss line.

Preferably, the process employing arsenic implant set forth in copending application Ser. No. 897,318, filed Apr. 18, 1978 by Bartlett, Jordan and Mundt, assigned to Texas Instruments, is used to form these N+ regions, as the resulting enhanced oxide growth will aid in precise definition of the channel.

Figure 4C:
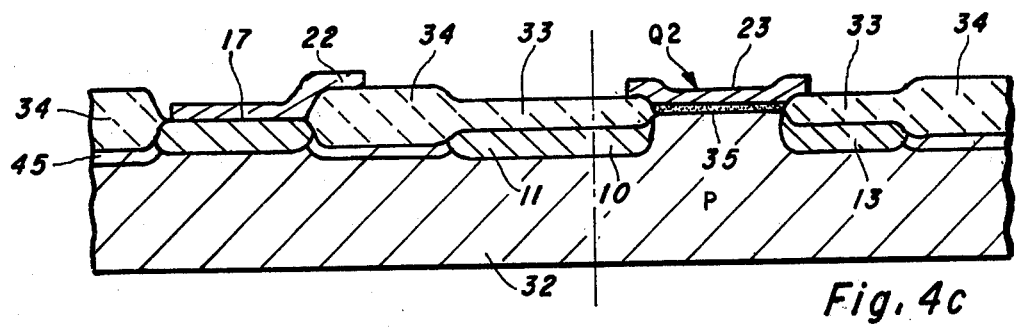

Referring to FIG. 4c, a second field oxidation step is now performed by placing the slice in steam or dry oxygen at about 1000° C. for several hours. This oxidizes all of the top of the slice not covered by the remaining parts of the nitride layer 42, producing thin field oxide 33 which is about 5000 Angstroms thickness. During this oxidation, the areas of field oxide 34 grow thicker, to perhaps 10,000 Angstroms. The N+ regions 46 are partly consumed but also diffuse further into the silicon ahead of the oxidation front to create the heavily doped regions 11, 12 and 13.

Next the remaining nitride layer 42 is removed by an etchant which attacks nitride but not silicon oxide, then the oxide 41 is removed by etching and the exposed silicon cleaned. The gate oxide 35 is grown by thermal oxidation to a thickness of about 500 to 800 Angstroms. In areas of the slice where depletion load devices are required, although not pertinent to this invention, a masked ion implant step would be done at this point. Likewise, the threshold voltage of the enhancement mode transistors in the cell array or periphery may be adjusted by ion implant. Also, windows in the oxide layer 35 for first level polysilicon to silicon contacts 17 and 18, and others if needed in the periphery, are patterned and etched at this point using photoresist.

Also as seen in FIG. 4c a first layer of polycrystalline silicon is deposited over the entire slice in a reactor using standard techniques to a thickness of about 5000 Angstroms. This first level polysilicon layer is patterned by applying a layer of photoresist, exposing to ultraviolet light through a mask prepared for this purpose, developing, then etching both photoresist and polysilicon.

Using the remaining polysilicon coating and its underlying thin oxide 35, as well as the field oxide 33 and 34, as a diffusion mask, the slice is now subjected to another N+ arsenic ion implant which is implanted and then driven into the silicon slice 32 to produce the source and drain regions 47 and 48 as well as the N+ regions 49 beneath the contact areas. The depth of drive in is about 4000 to 5000 Angstroms. In the peripheral circuitry, this diffusion can create regions which function as conductors to connect various regions together, and also function as the source or drain regions of other transistors. This diffusion renders highly conductive all of the exposed first level polysilicon areas such as gates 20 and 23, the strips 19 and 22, the line 31, etc. In the poly-to-moat contact areas 17 and 18 the N+ diffusion penetrates the poly and converts the underlying P-type silicon to N+ because here the oxide layer 35 has been removed.

Oxide is grown over the first level poly by thermal oxidation to produce a layer 38 of about 2000 Angstroms thickness and patterned using photoresist to open holes over the contact areas 17 and 18, i.e. second-poly to first-poly contact areas.

The second level of polycrystalline silicon is now deposited using a method as for the first level, providing a thickness of about 0.5 micron. The entire second level polycrystalline silicon coating is subjected to a phosphorous implantation which creates the characteristics of the resistors R1 and R2. Areas of polysilicon which are to be highly conductive will be later subjected to a phosphorus diffusion or implant which will leave them heavily doped. To define the resistor characteristics, this implant step is performed at 100 to 150 KeV to a dosage of from $5 \times 10^{13}$ to $1 \times 10^{14}$ phosphorus atoms per cm$^2$, depending upon the desired bulk resistivity for the resistors. Following this phosphorus implant for the resistors, the slices are annealled in an N$_2$ atmosphere for 30 minutes at 1000° C.; this is for the purpose of distributing the phosphorus properly in the polysilicon. For 0.5 micron thick polysilicon which has a sheet resistivity of ten megohms per square, and with a contact area or lateral area of $5 \times 5$ microns, the resistance of R1 and R2 would be ten megohms. The phosphorus implant serves to produce a resistivity of ideally about one to five megohms per square at 25° C. Lower resistivity results in too large cell size, and higher results in instability, non-reproducibility and excessive voltage dependence.

Figure 4D:
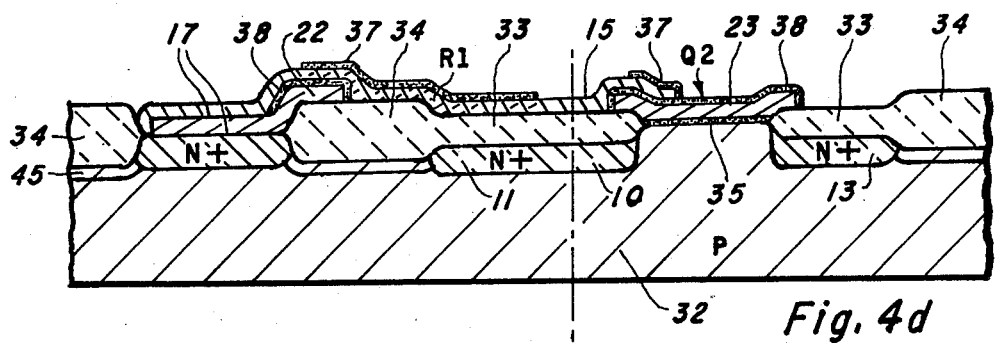

The second-level polysilicon coating is next patterned. This is done by applying a layer of photoresist, exposing to ultraviolet light through a mask prepared for this purpose, developing, then etching with the remaining photoresist masking certain areas of the polysilicon. The resulting structure is seen in FIG. 4d, where parts of the remaining polysilicon layer provide what will be the contacts to the Vdd line 14 and the contacts 17 and 18, as well as the resistors R1 and R2.

After patterning the second level polysilicon a protective cap of silicon dioxide is grown on the polysilicon, producing a coating 37 on all exposed surfaces of the poly, including tops and sides. The coating 37 is grown at about 900° C. in steam for about an hour, producing approximately 1500 Angstroms thickness and consuming part of the polysilicon. The function of the cap is to prevent deposition of impurities on the resistors or diffusion into the resistors. A photoresist masking and etching operation is then used to remove the coating 37 on all areas of second level polysilicon except over the resistors R1 and R2. The masked second-level poly is then subjected to a phosphorus deposition and diffusion, rendering the areas not covered by the oxide 37 highly conductive. Alternatively a phosphorus implant could be used, employing a photoresist mask and no oxide 37; this eliminates the oxidation and later removal of the oxide 37 over the resistor to make contact, and also avoids a high temperature diffusion operation which might cause some out-diffusion from the N+ moat. Next metal contact areas are defined in a 500 Å thermal oxide 49.

As seen in FIG. 3d, fabrication of the device is continued by depositing a thick layer 36 of phosphorus-doped oxide. Rather than by oxidizing, this is done by a low temperature reaction process using conventional chemical vapor deposition techniques. A layer 36 of about 10,000 Angstroms is produced, covering the entire slice. This deposition is followed by a "densification" step wherein the slice is heated at 950° C. for the purpose of eliminating minute holes or pores in the oxide. Subsequently, a photoresist operation opens windows in the oxide layer 36 in areas 15, 27 and 28 where contact is to be made from metal to the second level polysilicon and to the moat areas 37 and 38. Then, a layer of aluminum is deposited on the entire slice, and selectively etched using photoresist masking to produce the desired pattern of metal strips 14, 25 and 26.

In an array of a large number of the cells of FIG. 1, the layout on the chip would make use of considerable economy of space by mirroring the cell about an axis 50 to define the cell below the one shown, so the contacts 27 and 28 are shared with the adjacent cell above this axis.

Instead of employing a metal strip 14 as the Vdd line, second-level poly may be used for this purpose. In this case, the second-level polysilicon which forms the resistors R1 and R2 forms a continuous strip extending along the face similar to the strip 14, but it will be below the insulator coating 36. No metal-to-poly contact 15 is needed, of course. The elongated polysilicon Vdd line would be heavily doped so that it would be highly conductive.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any such modifications or embodiments as fall within the true scope of the invention.

What is claimed is:

1. A static memory cell of the type formed in a face of a semiconductor body comprising:
   a pair of driver transistors each having source and drain regions, a channel, and a gate, the source and drain regions being formed by heavily doped regions in the face of the semiconductor body beneath a layer of thermal field oxide, the gate of each of the driver transistors overlying the channel thereof and being separated therefrom by a thin gate oxide layer;
   conductive means including first level polysilicon separately connecting the drain regions of each of the driver transistors to the gate of the other driver transistor to provide a cross-coupled bistable circuit, the conductive means at least partially overlying said heavily doped regions but being insulated therefrom;
   a pair of access transistors each having a source to drain path and a gate;
   a pair of data lines on said face with means coupling each data line separately through the source to drain path of a different one of the access transistors to the drain region of a different one of the driver transistors;
   an address line including first level polysilicon on said face connected to the gate of both of the access transistors; and
   a pair of load resistors at said face of the body with each resistor having one end coupled to a voltage supply line on said face and an opposte end coupled separately to a different one of said drain regions of the driver transistors, the load resistors including second level polysilicon overlapping the driver transistors.

2. A memory cell according to claim 1 wherein the semiconductor body is predominantly P-type silicon, the heavily doped regions are N-type, the gates are first level polycrystalline silicon, and a layer of thick field oxide surrounds said layer of thermal field oxide.

3. A memory cell according to claim 1 wherein the source regions of the pair of driver transistors are part of an elongated heavily doped region extending along said face, said conductive means extending across such elongated region but insulated therefrom.

4. A cell according to claim 3 wherein said address line also extends across said elongated region but is isolated therefrom.

5. A cell according to claim 4 wherein the source to drain paths of the access transistors include heavily doped regions in the face of the body self-aligned with the first level polysilicon gates of the access transistors, such heavily doped regions not being covered by said layer of thermal field oxide.

6. A cell according to claim 5 wherein said voltage supply line is a conductive strip overlying said elongated region and running along said face parallel to the elongated region, and wherein said pair of data lines are conductive strips on said face parallel to the voltage supply line.

7. A cell according to claim 6 wherein said data lines are deposited metal and overlie said drain regions and said access transistors.

8. A cell according to claim 7 wherein said voltage supply line is deposited metal.

9. A cell according to claim 8 wherein said conductive means separately make contact to contact areas over heavily doped regions of said face contiguous with said drain regions of the driver transistors.

10. A cell according to claim 9 wherein said load resistors include doped highly conductive regions making contact separately with said contact areas.

* * * * *